(12) United States Patent
Chuang et al.

(10) Patent No.: US 8,558,278 B2
(45) Date of Patent: Oct. 15, 2013

(54) STRAINED TRANSISTOR WITH OPTIMIZED DRIVE CURRENT AND METHOD OF FORMING

(75) Inventors: Harry Chuang, Austin, TX (US); Kong-Beng Thei, Hsin-Chu (TW); Wen-Huei Guo, Chu-bei (TW); Mong Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 661 days.

(21) Appl. No.: 11/849,798

(22) Filed: Sep. 4, 2007

(65) Prior Publication Data
US 2008/0169484 A1    Jul. 17, 2008

Related U.S. Application Data

(60) Provisional application No. 60/880,563, filed on Jan. 16, 2007.

(51) Int. Cl.
  *H01L 27/092* (2006.01)
(52) U.S. Cl.
  USPC .......................................................... 257/190
(58) Field of Classification Search
  USPC ......... 257/223, 227, 291, 292, 439, 443, 655, 257/E27.1, E27.125, E27.112, E29.117, 257/E29.145, E29.147, E29.151, E29.182, 257/E29.202, E29.273, E29.274, E29.275, 257/E29.276, E29.277, E29.278, E29.279, 257/E29.28, E29.281, E29.282, E29.283, 257/E29.284, E29.285, E29.286, E29.287, 257/E29.288, E29.289, E29.29, E29.291, 257/E29.292, E29.293, E29.294, E29.295, 257/E29.296, E29.297, E29.298, E29.299, 257/E29.314, E29.32, E23.016; 438/149, 438/257
See application file for complete search history.

(56) References Cited

U.S. PATENT DOCUMENTS

| 4,069,094 A | 1/1978 | Shaw et al. |
| 4,314,269 A | 2/1982 | Fujiki |
| 4,497,683 A | 2/1985 | Celler et al. |

(Continued)

FOREIGN PATENT DOCUMENTS

| EP | 0 683 522 A2 | 11/1995 |
| EP | 0 828 296 A2 | 3/1998 |
| WO | WO-03/017336 A2 | 2/2003 |

OTHER PUBLICATIONS

"1-D and 2-D Geometry Effects in Uniaxially-Strained Dual Etch Stop Layer Stressor Integrations" by Grudowski et al. 2006 Symposium on VLSI Technology Digest of Technical Papers, 01-4244-0005-8/06/$20.00 (c) 2006 IEEE.*

(Continued)

*Primary Examiner* — Marcos D. Pizarro
*Assistant Examiner* — Sue Tang
(74) *Attorney, Agent, or Firm* — Slater & Matsil, L.L.P.

(57) ABSTRACT

A strain-induced layer is formed atop a MOS device in order to increase carrier mobility in the channel region. The dimension of the strain-induced layer in preferred embodiments may lead to an optimized drive current increase and improved drive current uniformity in an NMOS and PMOS device. An advantage of the preferred embodiments is that improved device performance is obtained without adding complex processing steps. A further advantage of the preferred embodiments is that the added processing steps can be readily integrated into a known CMOS process flow. Moreover, the creation of the photo masks defining the tensile and compressive strain-induced layers does not require extra design work on an existed design database.

20 Claims, 17 Drawing Sheets

(56) References Cited

U.S. PATENT DOCUMENTS

| | | |
|---|---|---|
| 4,631,803 A | 12/1986 | Hunter et al. |
| 4,892,614 A | 1/1990 | Chapman et al. |
| 4,946,799 A | 8/1990 | Blake et al. |
| 4,952,993 A | 8/1990 | Okumura |
| 5,130,773 A | 7/1992 | Tsukada |
| 5,155,571 A | 10/1992 | Wang et al. |
| 5,273,915 A | 12/1993 | Hwang et al. |
| 5,338,960 A | 8/1994 | Beasom |
| 5,378,919 A | 1/1995 | Ochiai |
| 5,447,884 A | 9/1995 | Fahey et al. |
| 5,461,250 A | 10/1995 | Burghartz et al. |
| 5,479,033 A | 12/1995 | Baca et al. |
| 5,525,828 A | 6/1996 | Bassous et al. |
| 5,534,713 A | 7/1996 | Ismail et al. |
| 5,596,529 A | 1/1997 | Noda et al. |
| 5,629,544 A | 5/1997 | Voldman et al. |
| 5,656,524 A | 8/1997 | Eklund et al. |
| 5,708,288 A | 1/1998 | Quigley et al. |
| 5,714,777 A | 2/1998 | Ismail et al. |
| 5,763,315 A | 6/1998 | Benedict et al. |
| 5,783,850 A | 7/1998 | Liau et al. |
| 5,789,807 A | 8/1998 | Correale, Jr. |
| 5,811,857 A | 9/1998 | Assaderaghi et al. |
| 5,936,276 A | 8/1999 | Maurelli et al. |
| 5,955,766 A | 9/1999 | Ibi et al. |
| 5,965,917 A | 10/1999 | Maszara et al. |
| 5,972,722 A | 10/1999 | Visokay et al. |
| 6,008,095 A | 12/1999 | Gardner et al. |
| 6,015,993 A | 1/2000 | Voldman et al. |
| 6,027,988 A | 2/2000 | Cheung et al. |
| 6,046,487 A | 4/2000 | Benedict et al. |
| 6,059,895 A | 5/2000 | Chu et al. |
| 6,096,591 A | 8/2000 | Gardner et al. |
| 6,100,153 A | 8/2000 | Nowak et al. |
| 6,100,204 A | 8/2000 | Gardner et al. |
| 6,103,599 A | 8/2000 | Henley et al. |
| 6,107,125 A | 8/2000 | Jaso et al. |
| 6,111,267 A | 8/2000 | Fischer et al. |
| 6,190,996 B1 | 2/2001 | Mouli et al. |
| 6,222,234 B1 | 4/2001 | Imai |
| 6,232,163 B1 | 5/2001 | Voldman et al. |
| 6,256,239 B1 | 7/2001 | Akita et al. |
| 6,258,664 B1 | 7/2001 | Reinberg |
| 6,281,059 B1 | 8/2001 | Cheng et al. |
| 6,291,321 B1 | 9/2001 | Fitzgerald |
| 6,294,834 B1 | 9/2001 | Yeh et al. |
| 6,303,479 B1 | 10/2001 | Snyder |
| 6,339,232 B1 | 1/2002 | Takagi |
| 6,358,791 B1 | 3/2002 | Hsu et al. |
| 6,387,739 B1 | 5/2002 | Smith, III |
| 6,396,137 B1 | 5/2002 | Klughart |
| 6,396,506 B1 | 5/2002 | Hoshino et al. |
| 6,407,406 B1 | 6/2002 | Tezuka |
| 6,413,802 B1 | 7/2002 | Hu et al. |
| 6,414,355 B1 | 7/2002 | An et al. |
| 6,420,218 B1 | 7/2002 | Yu |
| 6,420,264 B1 | 7/2002 | Talwar et al. |
| 6,429,061 B1 | 8/2002 | Rim |
| 6,433,382 B1 | 8/2002 | Orlowski et al. |
| 6,448,114 B1 | 9/2002 | An et al. |
| 6,448,613 B1 | 9/2002 | Yu |
| 6,475,838 B1 | 11/2002 | Bryant et al. |
| 6,475,869 B1 | 11/2002 | Yu |
| 6,489,215 B2 | 12/2002 | Mouli et al. |
| 6,489,664 B2 | 12/2002 | Re et al. |
| 6,489,684 B1 | 12/2002 | Chen et al. |
| 6,495,900 B1 | 12/2002 | Mouli et al. |
| 6,498,359 B2 | 12/2002 | Schmidt et al. |
| 6,518,610 B2 | 2/2003 | Yang et al. |
| 6,521,952 B1 | 2/2003 | Ker et al. |
| 6,524,905 B2 | 2/2003 | Yamamichi et al. |
| 6,525,403 B2 | 2/2003 | Inaba et al. |
| 6,541,343 B1 | 4/2003 | Murthy et al. |
| 6,555,839 B2 | 4/2003 | Fitzgerald |
| 6,558,998 B2 | 5/2003 | Belleville et al. |
| 6,573,172 B1 | 6/2003 | En et al. |
| 6,576,526 B2 | 6/2003 | Kai et al. |
| 6,586,311 B2 | 7/2003 | Wu |
| 6,600,170 B1 | 7/2003 | Xiang |
| 6,617,643 B1 | 9/2003 | Goodwin-Johansson |
| 6,621,131 B2 | 9/2003 | Murthy et al. |
| 6,633,070 B2 | 10/2003 | Miura et al. |
| 6,646,322 B2 | 11/2003 | Fitzgerald |
| 6,653,700 B2 | 11/2003 | Chau et al. |
| 6,657,259 B2 | 12/2003 | Fried et al. |
| 6,657,276 B1 | 12/2003 | Karlsson et al. |
| 6,674,100 B2 | 1/2004 | Kubo et al. |
| 6,686,247 B1 | 2/2004 | Bohr |
| 6,690,082 B2 | 2/2004 | Lakshmikumar |
| 6,720,619 B1 | 4/2004 | Chen et al. |
| 6,724,019 B2 | 4/2004 | Oda et al. |
| 6,734,527 B1 | 5/2004 | Xiang |
| 6,737,710 B2 | 5/2004 | Cheng et al. |
| 6,740,535 B2 | 5/2004 | Singh et al. |
| 6,759,717 B2 | 7/2004 | Sagarwala et al. |
| 6,762,448 B1 | 7/2004 | Lin et al. |
| 6,784,101 B1 | 8/2004 | Yu et al. |
| 6,794,764 B1 | 9/2004 | Kamal et al. |
| 6,797,556 B2 | 9/2004 | Murthy et al. |
| 6,798,021 B2 | 9/2004 | Ipposhi et al. |
| 6,803,641 B2 | 10/2004 | Papa Rao et al. |
| 6,812,103 B2 | 11/2004 | Wang et al. |
| 6,815,288 B2 | 11/2004 | Kim |
| 6,821,840 B2 | 11/2004 | Wieczorek et al. |
| 6,830,962 B1 | 12/2004 | Guarini et al. |
| 6,861,318 B2 | 3/2005 | Murthy et al. |
| 6,867,101 B1 | 3/2005 | Yu |
| 6,867,433 B2 | 3/2005 | Yeo et al. |
| 6,872,610 B1 | 3/2005 | Mansoori et al. |
| 6,882,025 B2 | 4/2005 | Yeo et al. |
| 6,885,084 B2 | 4/2005 | Murthy et al. |
| 6,891,192 B2 | 5/2005 | Chen et al. |
| 6,900,502 B2 | 5/2005 | Ge et al. |
| 6,924,181 B2 | 8/2005 | Huang et al. |
| 6,936,506 B1 | 8/2005 | Buller et al. |
| 6,936,881 B2 | 8/2005 | Yeo et al. |
| 6,939,814 B2 | 9/2005 | Chan et al. |
| 6,940,705 B2 | 9/2005 | Yeo et al. |
| 6,969,618 B2 | 11/2005 | Mouli |
| 6,982,433 B2 | 1/2006 | Hoffman et al. |
| 6,998,311 B2 | 2/2006 | Forbes et al. |
| 7,029,994 B2 | 4/2006 | Ge et al. |
| 7,052,964 B2 | 5/2006 | Yeo et al. |
| 7,071,052 B2 | 7/2006 | Yeo et al. |
| 7,081,395 B2 | 7/2006 | Chi et al. |
| 7,101,742 B2 | 9/2006 | Ko et al. |
| 7,112,495 B2 | 9/2006 | Ko et al. |
| 7,164,163 B2 | 1/2007 | Chen et al. |
| 7,193,269 B2 * | 3/2007 | Toda et al. ............... 257/328 |
| 7,220,630 B2 | 5/2007 | Cheng et al. |
| 7,268,024 B2 | 9/2007 | Yeo et al. |
| 7,303,955 B2 * | 12/2007 | Kim ............... 438/257 |
| 7,354,843 B2 | 4/2008 | Yeo et al. |
| 7,442,967 B2 | 10/2008 | Ko et al. |
| 7,528,028 B2 | 5/2009 | Liang et al. |
| 2001/0028089 A1 | 10/2001 | Adan |
| 2002/0008289 A1 | 1/2002 | Murota et al. |
| 2002/0031890 A1 | 3/2002 | Watanabe et al. |
| 2002/0045318 A1 | 4/2002 | Chen et al. |
| 2002/0074598 A1 | 6/2002 | Doyle et al. |
| 2002/0076899 A1 | 6/2002 | Skotnicki et al. |
| 2002/0125471 A1 | 9/2002 | Fitzgerald et al. |
| 2002/0140031 A1 | 10/2002 | Rim |
| 2002/0153549 A1 | 10/2002 | Laibowitz et al. |
| 2002/0163036 A1 | 11/2002 | Miura et al. |
| 2002/0190284 A1 | 12/2002 | Murthy et al. |
| 2003/0001219 A1 | 1/2003 | Chau et al. |
| 2003/0030091 A1 | 2/2003 | Bulsara et al. |
| 2003/0080361 A1 | 5/2003 | Murthy et al. |
| 2003/0080386 A1 | 5/2003 | Ker et al. |
| 2003/0080388 A1 | 5/2003 | Disney et al. |
| 2003/0098479 A1 | 5/2003 | Murthy et al. |
| 2003/0136985 A1 | 7/2003 | Murthy et al. |
| 2003/0162348 A1 | 8/2003 | Yeo et al. |

(56) References Cited

U.S. PATENT DOCUMENTS

| | | | |
|---|---|---|---|
| 2003/0181005 A1* | 9/2003 | Hachimine et al. | 438/231 |
| 2003/0183880 A1 | 10/2003 | Goto et al. | |
| 2003/0227013 A1 | 12/2003 | Currie et al. | |
| 2004/0016972 A1 | 1/2004 | Singh et al. | |
| 2004/0018668 A1 | 1/2004 | Maszara | |
| 2004/0026765 A1 | 2/2004 | Currie et al. | |
| 2004/0029323 A1 | 2/2004 | Shimizu et al. | |
| 2004/0063300 A1 | 4/2004 | Chi | |
| 2004/0070035 A1 | 4/2004 | Murthy et al. | |
| 2004/0087098 A1 | 5/2004 | Ng et al. | |
| 2004/0104405 A1 | 6/2004 | Huang et al. | |
| 2004/0108598 A1 | 6/2004 | Cabral, Jr. et al. | |
| 2004/0129982 A1* | 7/2004 | Oda et al. | 257/369 |
| 2004/0140506 A1 | 7/2004 | Singh et al. | |
| 2004/0173815 A1 | 9/2004 | Yeo et al. | |
| 2004/0179391 A1 | 9/2004 | Bhattacharyya | |
| 2004/0217448 A1 | 11/2004 | Kumagai et al. | |
| 2004/0262683 A1 | 12/2004 | Bohr et al. | |
| 2004/0266116 A1 | 12/2004 | Mears et al. | |
| 2005/0012087 A1 | 1/2005 | Sheu et al. | |
| 2005/0029601 A1 | 2/2005 | Chen et al. | |
| 2005/0035369 A1 | 2/2005 | Lin et al. | |
| 2005/0035410 A1 | 2/2005 | Yeo et al. | |
| 2005/0082522 A1 | 4/2005 | Huang et al. | |
| 2005/0093078 A1 | 5/2005 | Chan et al. | |
| 2005/0136584 A1 | 6/2005 | Boyanov et al. | |
| 2005/0186722 A1 | 8/2005 | Cheng et al. | |
| 2005/0224986 A1 | 10/2005 | Tseng et al. | |
| 2005/0224988 A1 | 10/2005 | Tuominen | |
| 2005/0236694 A1 | 10/2005 | Wu et al. | |
| 2005/0266632 A1 | 12/2005 | Chen et al. | |
| 2005/0269650 A1* | 12/2005 | Pidin | 257/411 |
| 2006/0001073 A1 | 1/2006 | Chen et al. | |
| 2006/0121727 A1 | 6/2006 | Metz et al. | |
| 2007/0040225 A1* | 2/2007 | Yang | 257/369 |
| 2007/0267680 A1 | 11/2007 | Uchino et al. | |
| 2008/0296695 A1 | 12/2008 | Yang | |
| 2009/0230439 A1 | 9/2009 | Wang et al. | |
| 2010/0078725 A1 | 4/2010 | Hou et al. | |

OTHER PUBLICATIONS

"Future Gate Stack," SEMATECH Inc., 2001 Annual Report, 2 pages.
Bednar, T. R., et al., "Issues and Strategies for the Physical Design of System-on-a-Chip ASICs," IBM Journal of Research and Development, vol. 46, No. 6, Nov. 2002, pp. 661-674.
Bianchi, R. A., et al., "Accurate Modeling of Trench Isolation Induced Mechanical Stress Effects on MOSFET Electrical Performance," IEDM, 2002, pp. 117-120.
Blaauw, D., et al., "Gate Oxide and Subthreshold Leakage Characterization, Analysis and Optimization," date unknown, 2 pages.
Cavassilas, N., et al., "Capacitance-Voltage Characteristics of Metal-Oxide-Strained Semiconductor Si/SiGe Heterostructures," Nanotech 2002, vol. 1, pp. 600-603.
Celik, M., et al., "A 45 nm Gate Length High Performance SOI Transistor for 100nm CMOS Technology Applications," 2002 Symposium on VLSI Technology Digest of Technical Papers, IEEE, pp. 166-167.
Chang, L., et al., "Direct-Tunneling Gate Leakage Current in Double-Gate and Ultrathin Body MOSFETs," IEEE Transactions on Electron Devices, vol. 49, No. 12, Dec. 2002, pp. 2288-2295.
Chang, L., et al., "Reduction of Direct-Tunneling Gate Leakage Current in Double-Gate and Ultra-Thin Body MOSFETs," IEEE, 2001, 4 pages.
Chau, R., et al., "A 50nm Depleted-Substrate CMOS Transistor (DST)," IEDM, 2001, pp. 621-624.
Chen, W., et al., "Suppression of the SOI Floating-Body Effects by Linked-Body Device Structure," 1996 Symposium on VLSI Technology Digest of Technical Papers, IEEE, pp. 92-93.
Fung, S. K. H. et al., "Gate Length Scaling Accelerated to 30nm Regime Using Ultra-Thin Film PD-SOI Technology," IEDM, 2001, pp. 629-632.

Gámiz, F., et al., "Electron Transport in Strained Si Inversion Layers Grown on SiGe-on-Insulator Substrates," Journal of Applied Physics, vol. 92, No. 1, Jul. 1, 2002, pp. 288-295.
Gámiz, F. et al., "Strained-Si/SiGe-on-Insulator Inversion Layers: The Role of Strained-Si Layer Thickness on Electron Mobility," Applied Physics Letters, vol. 80, No. 22, Jun. 3, 2002, pp. 4160-4162.
Ge, C.-H., et al., "Process-Strained Si (PSS) CMOS Technology Featuring 3D Strain Engineering," IEDM, 2003, pp. 73-76.
Geppert, L., "The Amazing Vanishing Transistor Act," IEEE Spectrum, Oct. 2002, pp. 28-33.
Ghani, T., et al., "A 90nm High Volume Manufacturing Logic Technology Featuring Novel 45nm Gate Length Strained Silicon CMOS Transistors," IEDM, 2003, pp. 978-980.
Huang, X., et al., "Sub-50 nm P-Channel FinFET," IEEE Transactions on Electron Devices, vol. 48, No. 5, May 2001, pp. 880-886.
Ismail, K., et al., "Electron Transport Properties of Si/SiGe Heterostructures: Measurements and Device Implications," Applied Physics Letters, vol. 63, No. 5, Aug. 2, 1993, pp. 660-662.
Ito, S., et al., "Mechanical Stress Effect of Etch-Stop Nitride and Its Impact on Deep Submicron Transistor Design," IEDM, 2000, pp. 247-250.
Jurczak, M., et al., "Silicon-on-Nothing (SON)—an Innovative Process for Advanced CMOS," IEEE Transactions on Electron Devices, vol. 47, No. 11, Nov. 2000, pp. 2179-2187.
Jurczak, M., et al., "SON (Silicon on Nothing)—A New Device Architecture for the ULSI Era," 1999 Symposium on VLSI Technology Digest of Technical Papers, IEEE, pp. 29-30.
Kanda, Y., "A Graphical Representation of the Piezoresistance Coefficients in Silicon," IEEE Transactions on Electron Devices, vol. ED-29, No. 1, Jan. 1982, pp. 64-70.
Leitz, C. W., et al., "Channel Engineering of SiGe-Based Heterostructures for High Mobility MOSFETs," Materials Research Society Symposium Proceedings, vol. 686, 2002, pp. 113-118.
Leitz, C. W. et al., "Hole Mobility Enhancements in Strained Si/ $Si_{1-y}Ge_y$ P-Type Metal-Oxide-Semiconductor Field-Effect Transistors Grown on Relaxed $Si_{1-x}Ge_x$ (x<y) Virtual Substrates," Applied Physics Letters, vol. 79, No. 25, Dec. 17, 2001, pp. 4246-4248.
Liu, K. C., et al., "A Novel Sidewall Strained-Si Channel nMOSFET," IEDM, 1999, pp. 63-66.
Maiti, C. K., et al., "Film Growth and Material Parameters," Application of Silicon-Germanium Heterostructure, Ch. 2, Institute of Physics Publishing, pp. 32-42.
Matthews, J. W., "Defects Associated with the Accommodation of Misfit between Crystals," The Journal of Vacuum Science and Technology, vol. 12, No. 1, Jan./Feb. 1975, pp. 126-133.
Matthews, J. W., et al., "Defects in Epitaxial Multilayers—I. Misfit Dislocations," Journal of Crystal Growth, vol. 27, 1974, pp. 118-125.
Matthews, J. W., et al., "Defects in Epitaxial Multilayers—II. Dislocation Pile-Ups, Threading Dislocations, Slip Lines and Cracks," Journal of Crystal Growth, vol. 29, 1975, pp. 273-280.
Matthews, J. W., et al., "Defects in Epitaxial Multilayers—III. Preparation of Almost Perfect Multilayers," Journal of Crystal Growth, vol. 32, 1976, pp. 265-273.
Mizuno, T., et al., "Novel SOI p-Channel MOSFETs with Higher Strain in Si Channel Using Double SiGe Heterostructures," IEEE Transactions on Electron Devices, vol. 49, No. 1, Jan. 2002, pp. 7-14.
Nayak, D. K., et al., "Enhancement-Mode Quantum-Well $Ge_xSi_{1-x}$ PMOS," IEEE Electron Device Letters, vol. 12, No. 4, Apr. 1991, pp. 154-156.
Ootsuka, F., et al., "A Highly Dense, High-Performance 130nm Node CMOS Technology for Large Scale System-on-a-Chip Applications," IEDM, 2000, pp. 575-578.
Ota, K., et al., "Novel Locally Strained Channel Technique for High Performance 55nm CMOS," IEDM, 2002, pp. 27-30.
Rim, K., et al., "Fabrication and Analysis of Deep Submicron Strained-Si N-MOSFET's," IEEE Transactions on Electron Devices, vol. 47, No. 7, Jul. 2000, pp. 1406-1415.
Rim, K., "Strained Si Surface Channel MOSFETs for High-Performance CMOS Technology," IEEE International Solid-State Circuits Conference, Digest of Technical Papers, 2001, pp. 116-117.
Schüppen, A., et al., "Mesa and Planar SiGe-HBTs on MBE-Wafers," Journal of Materials Science: Materials in Electronics, vol. 6, 1995, pp. 298-305.

(56) References Cited

OTHER PUBLICATIONS

Scott, G., et al., "NMOS Drive Current Reduction Caused by Transistor Layout and Trench Isolation Induced Stress," IEDM, 1999, pp. 827-830.

Shahidi, G. G., "SOI Technology for the GHz Era," IBM Journal of Research and Development, vol. 46, No. 2/3, Mar./May 2002, pp. 121-131.

Shimizu, A., et al., "Local Mechanical-Stress Control (LMC): A New Technique for CMOS-Performance Enhancement," IEDM, 2001, pp. 433-436.

Tezuka, T., et al., "High-Performance Strained Si-on-Insulator MOSFETs by Novel Fabrication Processes Utilizing Ge-Condensation Technique," 2002 Symposium on VLSI Technology Digest of Technical Papers, IEEE, pp. 96-97.

Thompson, S., et al., "A 90 nm Logic Technology Featuring 50nm Strained Silicon Channel Transistors, 7 Layers of Cu Interconnects, Low k ILD, and 1 um$^2$ SRAM Cell," IEDM, 2002, pp. 61-64.

Tiwari, S. et al., "Hole Mobility Improvement in Silicon-on-Insulator and Bulk Silicon Transistors Using Local Strain," IEDM, 1997, pp. 939-941.

Wang, L. K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

Welser, J. et al., "NMOS and PMOS Transistors Fabricated in Strained Silicon/Relaxed Silicon-Germanium Structures," IEDM, 1992, pp. 1000-1002.

Wong, H.-S. P., "Beyond the Conventional Transistor," IBM Journal of Research and Development, vol. 46, No. 2/3, Mar./May 2002, pp. 133-167.

Yang, F.-L., et al., "25 nm CMOS Omega FETs," IEDM, 2002, pp. 255-258.

Yang, F.-L., et al., "35nm CMOS FinFETs," 2002 Symposium on VLSI Technology Digest of Technical Papers, IEEE, pp. 104-105.

Yeo, Y.-C., et al., "Enhanced Performance in Sub-100 nm CMOSFETs Using Strained Epitaxial Silicon-Germanium," IEDM, 2000, pp. 753-756.

Yeoh, J. C., et al., "MOS Gated Si:SiGe Quantum Wells Formed by Anodic Oxidation," Semiconductor Science and Technology, vol. 13, 1998, pp. 1442-1445.

Grudowski, P., et al., "1-D and 2-D Geometry Effects in Uniaxially-Strained Dual Etch Stop Layer Stressor Integrations," 2006 Symposium on VLSI Technology Digest of Technical Papers, IEEE, 2006, 2 pages.

Uejima, K., et al., "Highly Efficient Stress Transfer Techniques in Dual Stress Liner CMOS Integration," 2007 Symposium on VLSI Technology Digest of Technical Papers, Paper 12A-4, IEEE, 2007, pp. 220-221.

Wolf, S., et al., "Silicon Processing for the VLSI Era,", vol. 1: Process Technology, Second Edition, Lattice Press, Sunset Beach, CA, 2000, pp. 834-835.

Wolf, S., et al, "Silicon Processing for the VLSI Era,", vol. 2: Process Integration, Lattice Press, Sunset Beach, CA, 2000, pp. 144-145.

Wolf, S., et al., "Silicon Processing for the VLSI Era,", vol. 1: Process Technology, Second Edition, Lattice Press, Sunset Beach, CA, 2000, pp. 374-385.

Wolf, S., et al., "Silicon Processing for the VLSI Era,", vol. 2: Process Integration, Lattice Press, Sunset Beach, CA, 2000, pp. 658-663.

\* cited by examiner

STRAINED TRANSISTOR WITH OPTIMIZED DRIVE CURRENT AND METHOD OF FORMING

This application claims the benefit of U.S. Provisional Application No. 60/880,563, filed on Jan. 16, 2007, entitled "Dual Contact Etching Stop Layer Scheme for Advanced Device Control," which application is hereby incorporated herein by reference.

TECHNICAL FIELD

The present invention relates generally to semiconductor devices, particularly to strained MOS transistors, and more particularly to strained MOS transistors with a strained layer formed over source/drain and gate regions, where carrier mobility is enhanced in a channel region.

BACKGROUND

While the scaling down of the device dimensions in a semiconductor integrated circuit continues, maintaining high drive current at scaled voltages and smaller gate dimensions becomes more important. Device drive current is closely related to gate length, gate capacitance, and carrier mobility. Different technology innovations have been made to address this issue. For example, strained silicon technology is demonstrated to boost carrier mobility in a MOS transistor without narrowing channel length. High-K (dielectric constant) gate dielectric is adopted to increase gate capacitance. A metal-gate electrode is used to increase gate capacitance and, therefore, increase the device drive current. A nonplanar device structure such as a FinFET transistor is developed to enable steeper channel-length scaling. Among these efforts, strained silicon technology has been demonstrated to significantly increase carrier mobility without adding much complexity into the existing manufacturing process.

With strained silicon technology, a silicon atom in a MOS transistor is displaced in its lattice. The displacement significantly reconfigures the energy band structure in the silicon to accelerate the flow of electrons and holes, thus increasing device drive current. Strain can be applied to a MOS transistor in different ways. One way to develop strain in a MOS transistor is by selectively forming an epitaxial layer of SiGe (silicon germanium) at the source/drain regions of a conventional MOS transistor. Because the lattice constant of the SiGe is larger than that of Si, the channel region between the two SiGe source/drain is placed under compressive stress. This device configuration enhances hole mobility in the channel region, thus increasing the drive current of a PMOS device. Conversely, a layer of silicon can be formed atop a relaxed SiGe layer. MOS transistors are then formed on the silicon layer. Due to the lattice constant mismatch between Si and SiGe, the Si layer is under constant biaxial, in-plane tensile strain. This device configuration has a benefit of enhancing the electron mobility in an NMOS device.

Strain can also be applied by forming a strained layer on a MOS transistor. The strained layer is also generally referred to as a strain-induced layer, stress layer, contact etching stop (CES) layer, or CES trained layer. In forming a CES layer, a silicon nitride film is deposited over a completed MOS transistor covering the source/drain regions, gate electrode and spacers. Because of the lattice spacing mismatch between the CES layer and underlying layer, an in-plane stress develops to match the spacing. A CES layer thus formed may exhibit different film stress over a broad range, from tensile to compressive, by controlling the N—H, Si—H and Si—N bond ratios in the CES layer and optimizing deposition conditions such as power, temperature and pressure in the processing chamber. It has been revealed that in-plane tensile stress in the channel region enhances electron mobility, thus increasing drive current in an NMOS device, and compressive stress parallel to channel length direction can enhance hole mobility, thus improving PMOS device performance.

FIG. 1 illustrates a strained NMOS and PMOS device of prior art formed in proximity on a silicon substrate 1. Shallow trench isolations (STI) 10 are formed in the silicon substrate 1 to isolate the NMOS device from the PMOS device. A tensile CES layer 14 formed atop the NMOS device introduces an in-plane tensile strain in the channel region 11, and therefore improves the drive current of the NMOS device. A compressive CES layer 16 formed atop the PMOS device introduces a compressive strain in the channel region 13, and therefore improves the drive current of the PMOS device. Although it is observed that the improvement on drive current is influenced by CES layer parameters such as the level of stress, the layer thickness, and the layer dimension. Little is revealed from prior art on how and in what manner these parameters affect the drive current in each type of MOS transistors. This situation has kept the current CES strained silicon technique more of a rule of thumb approach, where little can be done on device and process parameters to obtain an optimized increase on the device drive current. Moreover, in the prior art CES strained MOS transistors, the uniformity between enhanced MOS transistor drive currents is poor and scaled increase in drive current is difficult to achieve. This may result in detrimental effects in an integrated circuit such as skewed switching threshold, deteriorated noise margin, increased device time delay, and even a collapse of logic.

In view of these and other problems in the prior CES strain efforts to enhance carrier mobility and improve device performance, there is a need for a method of obtaining an optimized drive current increase with desired uniformity by fine tuning CES layer parameters in advanced MOS transistors.

SUMMARY OF THE INVENTION

These and other problems are generally solved or circumvented, and technical advantages are generally achieved, by preferred embodiments of the present invention which provide a CES strained NMOS and PMOS devices having CES layer dimensions in a specific range, which can lead to an optimized drive current increase and improved drive current uniformity in an NMOS and PMOS device, and method of forming.

In accordance with one preferred embodiment of the present invention, a semiconductor device formed in a substrate comprises an OD region, a gate region overlying the OD region having an gate electrode on top, a source and drain region formed on the opposite side of the gate region, substantially aligned with an edge of the gate region and the edges of the OD region, a compressive-stress layer having a first and second edge substantially conformally over the gate electrode and the OD region, wherein the space between a gate electrode edge and the first edge is greater than 0.4 um, wherein the space between an OD edge and the second edge is in the range of between about 60 nm to about 400 nm.

In accordance with another preferred embodiment of the present invention, a semiconductor device formed in a semiconductor substrate comprises a first PMOS transistor formed in a P-type OD region with a first and second edge, having a first poly gate electrode overlying the P-type OD region, parallel to the first edge, an first NMOS transistor formed in an N-type OD region, having a second poly gate electrode overlying said N-type OD region, a first compressive-stress layer having a first and second edge substantially conformally over the first gate electrode and the P-type OD region, wherein the space between an edge of the first gate electrode and the first edge of the compressive-stress layer is greater than 0.4 um, wherein the space between the second P-type OD edge and the second edge of the compressive-stress layer is in the range of between about 60 nm to about 400 nm.

In accordance with yet another preferred embodiment of the present invention, a PMOS transistor formed in a P-type active region (OD) in a semiconductor substrate comprises a gate region overlying the OD region having a poly gate electrode on the top, a source and drain region formed on the opposite side of the gate region, substantially aligned with an edge of the gate region and the edges of the OD region, a compressive-stress layer substantially conformally over the gate electrode and the OD region having a first and second edge, wherein the space between an edge of the gate electrode and the first edge of the compressive-stress layer is in the range of one to two times either P or G, whichever is larger, where P is the minimum design rule gate poly to P-type OD dimension, and G is the minimum design rule poly-to-poly spacing on an P-type OD region, wherein the space between an P-type OD edge and the second edge of the compressive-stress layer is in the range of between about one-third to about two-thirds of the sum of L and H, where L is the minimum P-type OD to N-well boundary dimension and H is the minimum spacing between an N-type OD and an N-well boundary.

An advantage of the preferred embodiments of the present invention is that it provides an optimized drive current increase in a CES strained PMOS device without adding complex processing steps. CES strained MOS transistors also exhibit improved drive current uniformity.

A further advantage of a preferred embodiment of the present invention is that the added process steps can be readily integrated into a known CMOS process flow. Moreover, the creation of the photo masks defining the tensile and compressive CES layers does not require rework on an existed design database, and no extra design rules are imposed on the design and layout engineers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely CES strained NMOS and PMOS devices with an optimized drive current and method of forming. MOS devices thus formed also exhibit an improved uniformity among drive currents. The intermediate stages of manufacturing a preferred embodiment of the present invention are illustrated. The variations of the preferred embodiments are discussed. Throughout the various views and illustrative embodiments, like reference numbers are used to designate like elements.

Figure 1:
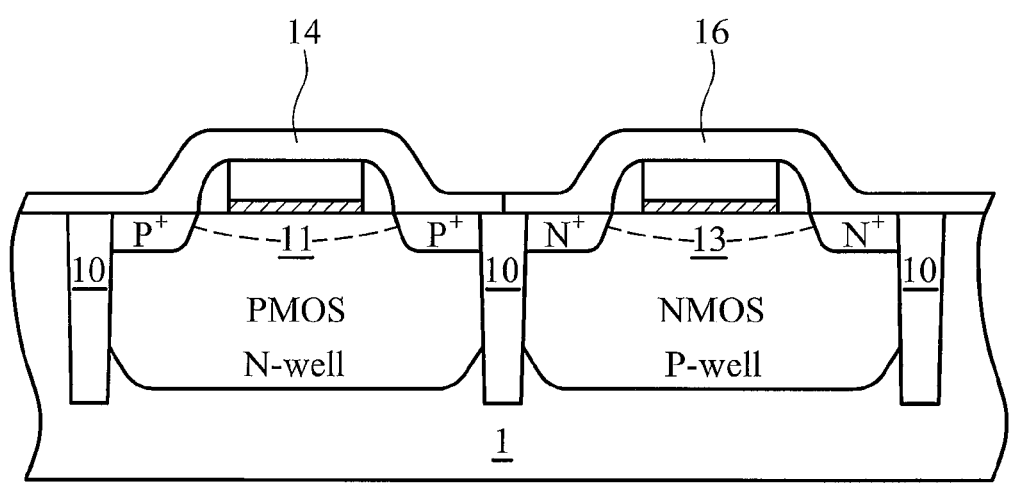
FIG. 1 is a cross-sectional view of a strained NMOS and PMOS device of prior art formed in proximity on a silicon substrate.
Figure 2:
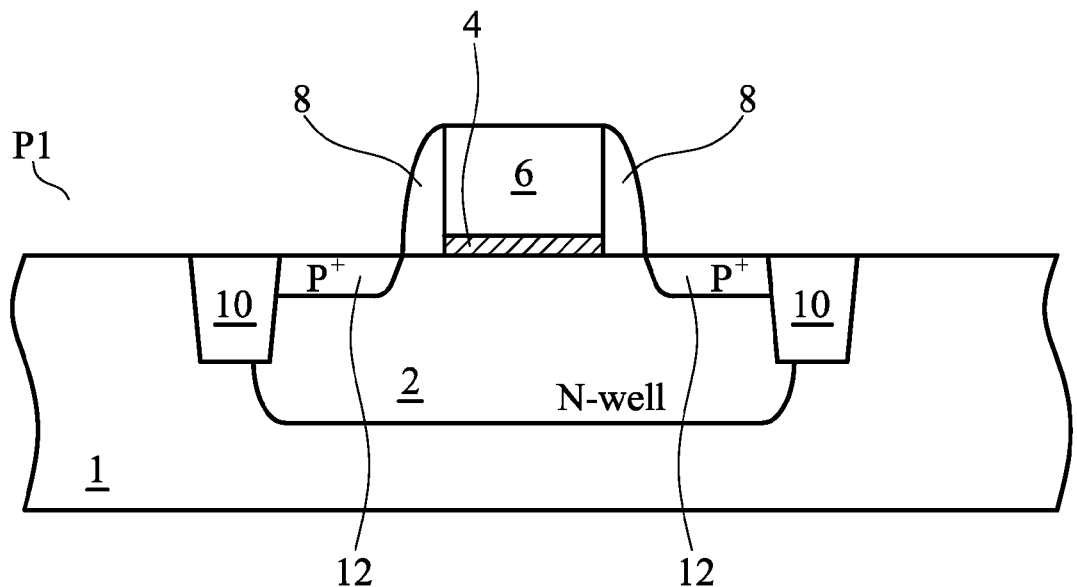
FIG. 2 illustrates the formation of a CES strained PMOS transistor P1 in a preferred embodiment.

FIG. 2 illustrates the formation of a CES strained PMOS transistor P1 in a preferred embodiment. P1 is formed in an N-well 2, which is formed on a silicon substrate 1. In other embodiments, P1 is formed in a bulk N-type silicon substrate. In yet other embodiments, a substrate made of strained semiconductor, compound semiconductor, multi-layers semiconductor or silicon on insulator (SOI), strained silicon-on-insulator (SSOI), strained silicon germanium on insulator (S—SiGeOI), silicon germanium on insulator (SiGeOI), germanium on insulator (GeOI), and the like, can be used to form P1 from therein. Shallow trench isolations (STI) 10 are formed in the silicon substrate 1 to isolate P1 from adjacent devices. Preferably, the STIs 10 are formed by etching shallow trenches in the silicon substrate 1, and filling the trenches with an insulator such as silicon dioxide ($SiO_2$).

A gate dielectric 4 is deposited on the surface of the silicon substrate 1. The gate dielectric 4 may preferably be $SiO_2$ formed by any of the known methods, such as thermal oxidation, local oxidation of silicon (LOCOS), chemical vapor deposition (CVD), etc. Silicon nitride can also be used since it is an effective barrier to impurity diffusion. The silicon nitride film is preferably formed by thermal nitridation of silicon. It can also be prepared by plasma anodic nitridation using nitrogen-hydrogen. The silicon nitride film may also be formed by thermal nitridation of $SiO_2$. The gate dielectric may also be oxy-nitride, oxygen-containing dielectric, nitrogen-containing dielectric, high-k materials or any combinations thereof.

A gate electrode 6 is formed on gate dielectric 4. The gate electrode 6 is preferably polysilicon (referred to hereafter as "poly"), although it may be formed of metal, or a compound structure comprising a metal, semiconductor, metal oxide and/or silicide. The preferred method of formation is CVD. Other embodiments may use amorphous silicon, elemental metals that are conductive, alloys of elemental metals that are conductive, silicides or nitrides of elemental metals that are conductive, or any combination thereof. Typically, the gate electrode 6 and gate dielectric 4 are deposited as layers and then patterned to form a gate. A pair of spacers 8 is formed along the sidewalls of the gate dielectric 4 and gate electrode 6. As known in the art, spacers 8 are preferably formed by blanket depositing a dielectric layer over an entire region, then, anisotropically etching to remove the dielectric layer from horizontal surfaces, thus leaving spacers 8. FIG. 2 illustrates rectangular spacers.

In the preferred embodiment, the source/drain regions 12 are formed by implanting P-type impurities, such as boron, into the N-well 2. The spacers 8 are used as a mask so that edges of the source/drain regions 12 are substantially aligned with the spacers 8. Gate electrode 6 is preferably also implanted to reduce sheet resistance. In other embodiments, the source/drain regions 12 are formed by recessing the source/drain regions 12 followed by epitaxially growing silicon, SiGe, or SiC in the recesses with a desired dopant. This structure provides a compressive stress to the channel of the PMOS device and enhances hole mobility. In yet other embodiments, source/drain regions 12 are formed by epitaxially growing silicon, SiGe, or SiC with desired dopant on the top surface of the silicon substrate 1. Preferably, a $SiO_2$ film is formed in regions where no source and drain is to be formed. The subsequently deposited epitaxial film on the $SiO_2$ film can be removed. In the source/drain regions (i.e., where substrate surface is exposed), epitaxial film is grown.

To reduce the resistance of the gate electrode 6 and source/drain regions 12, an optionally silicide layer (not shown) may be formed on the top of gate electrode 6 and source/drain regions 12 by a silicide process. The silicide is preferably $NiSi_2$, $CoSi_2$, $TiSi_2$, or the like. To form a silicide layer, a thin layer of metal such as cobalt, nickel, titanium, or the like, is sputtered over the device. The device is then annealed to form a silicide between the deposited metal and the underlying exposed silicon regions. Un-reacted metal is removed by an etch process.

Figure 3A:
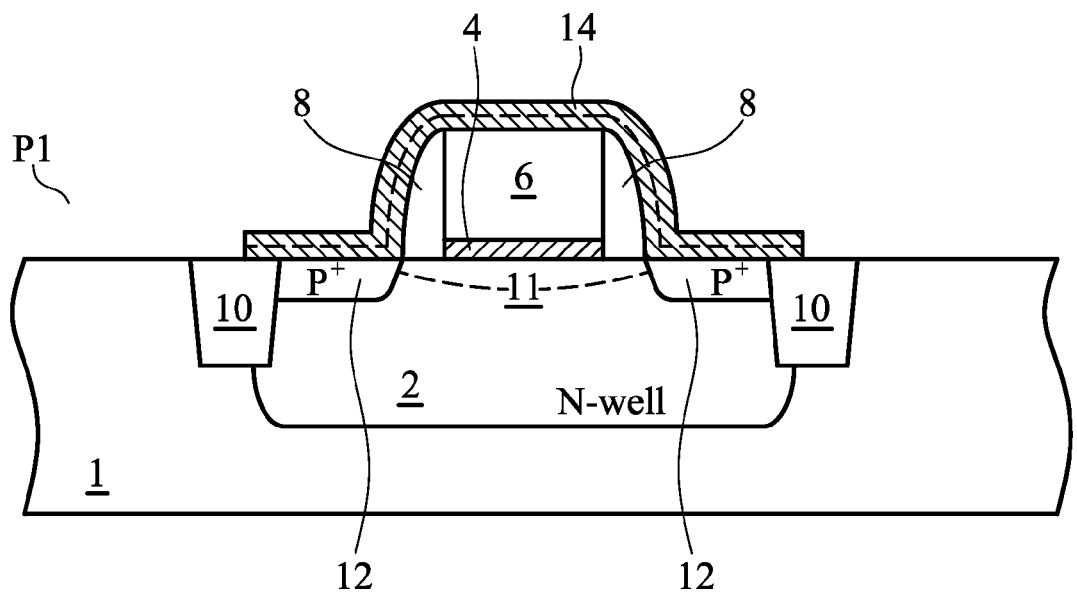
FIG. 3A shows a cross sectional view of a PMOS transistor P1 in a preferred embodiment with a CES strained layer formed on the top.

Next, as shown in FIG. 3A in a cross sectional view, a strain-inducing layer 14 is formed. Although this layer is preferably a CES layer and is interchangeably referred to as CES layer 14 throughout the description, it can be any strained layer or layers, even if the layer does not perform an etch stop function. The strain-inducing layer 14 may also be a composite layer (represented in FIG. 3A by the dashed line within the CES layer 14) comprising a CES layer and other layers. As previously discussed, this layer is strained in order to enhance the device performance. The types and strengths of the strain, also sometimes referred to as stress, are determined by the deposition process and material used. Generally, if a strained material has a smaller lattice constant than the underlying material, the strained material will have an inherent compressive strain and the underlying material will have an inherent tensile strain after relaxation. Conversely, if a strained material has a greater lattice constant than the underlying material, the strained material will have an inherent tensile strain and the underlying material will have an inherent compressive strain after relaxation.

In FIG. 3A, CES layer 14 is preferably formed of materials such as silicon nitride, oxynitride, oxide, silicon germanium or any combinations, generating compressive strain in the PMOS channel region. In other embodiments, a strained layer may be formed of materials such as silicon nitride, oxynitride, oxide, SiC, SiCN, $CoSi_2$ (Co silicide), $NiSi_2$ (Ni silicide), or any combinations, to create tensile strain in the channel region of an NMOS device. As known in the art, the type and magnitude of the strain are affected by the relative properties of the CES layer 14 and the underlying material.

Strain can also be adjusted by the type and concentration of impurities in the underlying material, which includes forming an epitaxial layer (not shown) in the source/drain regions 12.

In one preferred embodiment, an epitaxial layer of silicon germanium is formed in the silicon source/drain regions 12, which typically increases the material's lattice constant (because germanium has a larger lattice constant). This structure provides a compressive stress to the channel of the PMOS device and enhances hole mobility. In another embodiment, a silicon carbon epitaxial layer is formed in the silicon source/drain regions of an NMOS transistor, which typically decreases the material's lattice constant (because carbon has a smaller lattice constant). This structure provides a tensile stress to the channel of the NMOS device and enhances electron mobility.

In a preferred embodiment, a CES layer 14 comprises a dielectric material. In alternative embodiments, a CES layer 14 comprises semiconductors, metals, and combinations thereof. The CES layer 14 may also be in the form of a single layer or composite layers. An advantageous feature of such material, as explained herein, is that these materials have an inherent stress when deposited, which induces a strain in the underlying material. In preferred embodiments, the CES layer 14 has a thickness from about 5 nm to about 500 nm.

Figure 3B:
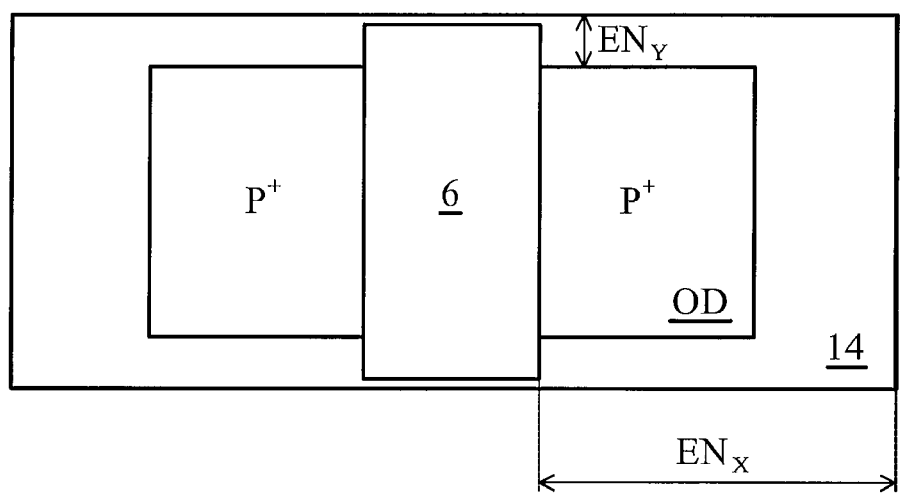
FIG. 3B illustrates a top view of the CES strained PMOS transistor P1 shown in FIG. 3A.

FIG. 3B illustrates a top view of the strained PMOS transistor P1 as shown in FIG. 3A. The CES layer 14 is formed over the active region, which includes the source/drain regions 12 and channel region 11. An active region defines the dimension of a MOS transistor and is hereafter referred to as an "OD" region. The CES layer 14 may also cover the N-well region (as shown in FIG. 3A). Although CES layer 14 is shown as one layer, it can be formed of different layers. In the preferred embodiments, a photo mask named PILD is used to pattern the CES layer 14. To clarify the description, the horizontal distance between the edge of poly gate 6 and the edge of CES layer 14 is referred to hereinafter as ENx. The vertical distance between the OD edge and the edge of strained layer 14 is referred to hereinafter as ENy. It is revealed from the preferred embodiments that, of each technology generation, a CES layer 14 having an ENx and ENy in a specific range can lead to an optimized PMOS drive current increase and an improved drive current uniformity, when compared with a CES strained MOS transistor, where no limitation is imposed on ENx and ENy. A CES strained PMOS device without limitations on the CES layer dimension is from hereinafter referred to as a baseline PMOS device.

In preferred embodiments, the values of an optimized range of ENx and ENy corresponding to a technology generation are obtained through a wafer acceptance test (WAT) on a plurality of CES strained core transistors, such as that shown in FIG. 3B. A core transistor has a generic MOS transistor configuration where a single poly gate is formed over an OD region. A core transistor is so called herein to distinguish itself from a MOS transistor with more complex structures, such as one with multiple poly gate fingers, and one with a single poly gate and multiple dummy poly fingers on an OD region.

Figure 4A:
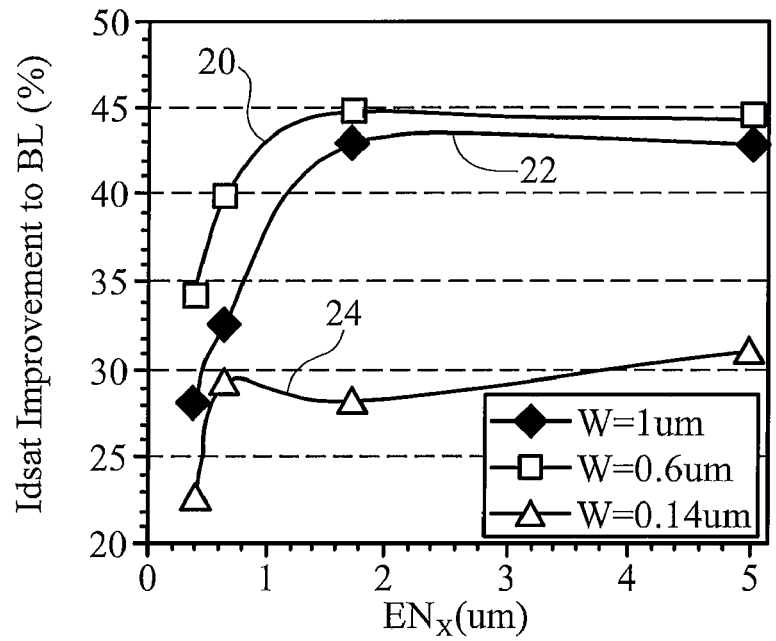
FIGS. 4A-4B illustrate the results from a wafer acceptance test (WAT) in obtaining the optimized range of ENx and ENy.

In obtaining the optimized range of ENx and ENy of a certain technology generation, a plurality of CES strained PMOS core transistors are formed on a silicon wafer scribe line. These transistors have a minimum channel length allowable by the specific technology generation (sometimes referred to as transistors with "on-rule" channel length) and channel width of various values. In one embodiment, a plurality of CES strained PMOS core transistors are provided, having a channel length of 65 nm and channel width (W) of 1 μm, 0.6 μm, and 0.14 μm. These transistors also have a fixed ENy of about 70 nm and ENx of various dimensions. Drive current (Idsat) is measured on each transistor, aiming to obtain an ENx corresponding to a maximum Idsat improvement. FIG. 4A shows the results from the WAT test. The plotting has an ENx on the horizontal coordinate and scaled Idsat improvement on the vertical coordinate, both in linear scale. Lines 20, 22, 24 illustrate the scaled drive current improvement upon a baseline PMOS device as a function of ENx. Lines 20, 22, and 24 correspond to transistors having a channel width of 1 µm, 0.6 µm, and 0.14 µm, respectively. It is shown that, significant increase of Idsat in the channel region is obtained when ENx reaches 0.4 µm. When ENx increases, Idsat in the channel region continues to increase. When ENx reaches about 1.8 µm, maximum Idsat increase is obtained on PMOS transistors with various channel width. Idsat remains substantially unchanged when ENx continues to increase.

Figure 4B:
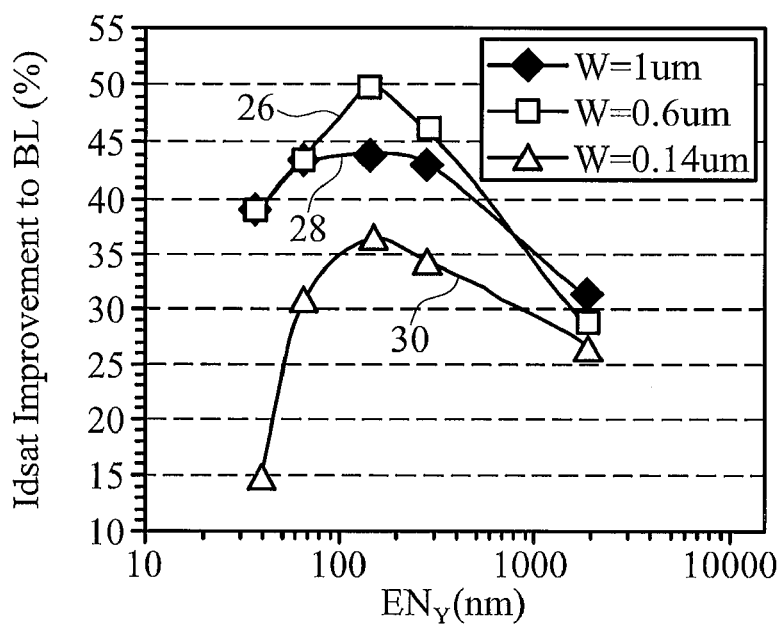

A similar test is carried out to obtain the optimized range of ENy. In one embodiment, PMOS transistors used for obtaining the optimized range of ENy have a fixed ENx of about 0.5 µm and ENy of various dimensions. FIG. 4B shows results obtained from measuring the drive current with different ENy values. The plotting has an ENy on the horizontal coordinate in logarithmic scale and drive current (Idsat) improvement on the vertical coordinate in linear scale. Lines 26, 28, and 30 correspond to transistors used to form lines 20, 22 and 24 in FIG. 4A. It is shown that, significant increase of Idsat in the channel region is obtained when ENy reaches 60 nm. When ENy increases, Idsat in the channel region continues to increase. The drive current Idsat maxes out when ENy reaches about 200 nm. Idsat drops significantly, however, when ENy exceeds 400 nm.

Figure 5A:
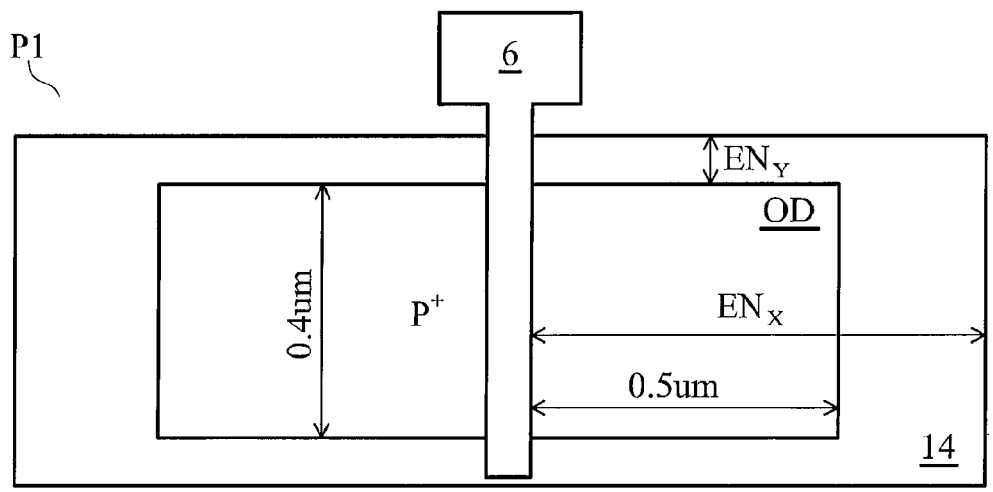
FIGS. 5A-5B illustrate that CES strained PMOS devices formed with optimized ENx and ENy also exhibit an improved drive current uniformity.
Figure 5B:
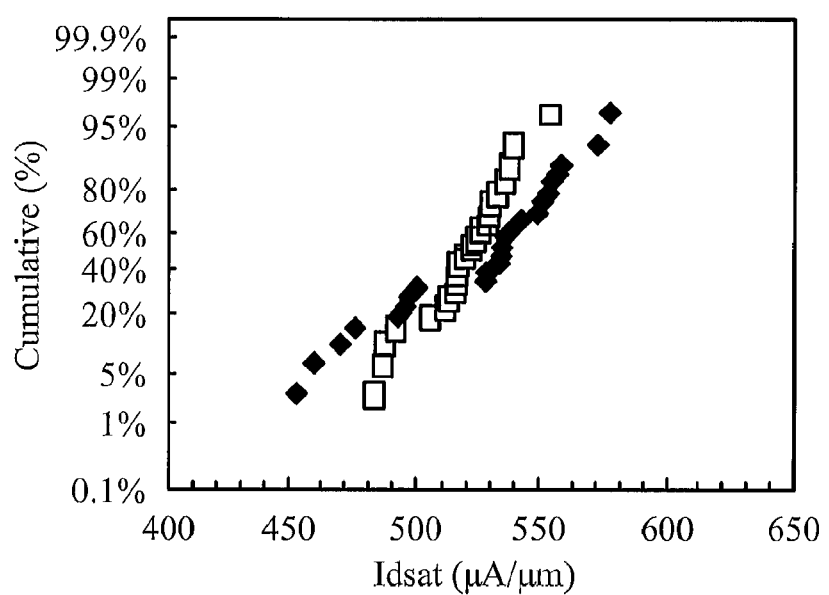

FIGS. 5A-5B illustrate that CES strained PMOS devices formed with optimized ENx and ENy also exhibit an improved uniformity (scaled increase) among the enhanced drive currents. In FIG. 5A, a PMOS transistor P1 having a single poly gate 6 is formed over an OD region. P1 has a gate length of 0.14 µm and gate width of 0.4 µm. The poly to OD dimension is 0.5 µm. A first plurality of PMOS device samples having the foregoing dimension is provided. A compressive CES 14 with desired ENx and ENy of about 0.7 µm and 70 nm is formed on each PMOS device sample, covering the OD region. Idsat is measured on each sample and plotted as square points in FIG. 5B. The vertical axis of FIG. 5B represents the cumulative percentage, which is used to illustrate the distribution of measured drive current Idsat. The solid diamonds in FIG. 5B are Idsat values measured on a second plurality of counterpart prior art CES strained PMOS devices, without constraints on the dimensions of ENx and ENy. It can be seen from FIG. 5B that Idsat from the embodied CES strained PMOS devices has an Idsat distribution of from about 480 µA/µm to about 550 µA/µm, while Idsat from the prior art CES strained devices has a distribution of from about 450 µA/µm to about 580 µA/µm. The Idsat uniformity (the quotient of standard deviation over mean value) is enhanced from about 7% to about 4%. The same trend has been observed through similar comparisons on PMOS devices of various configurations, such as PMOS with multiply poly fingers, PMOS with multiply dummy poly fingers formed over OD region, foregoing PMOS structures with various poly pitches.

Figure 6A:
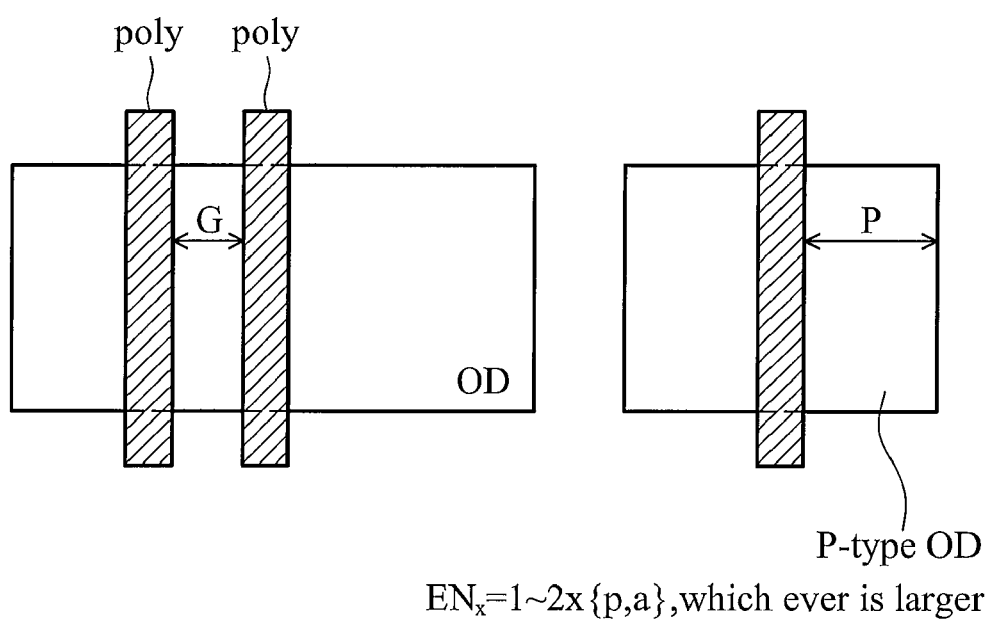
FIGS. 6A-6B illustrates the quantitative relationship between optimized ENx, ENy and minimum design rule dimensions and spacings of a certain processing technology.
Figure 6B:
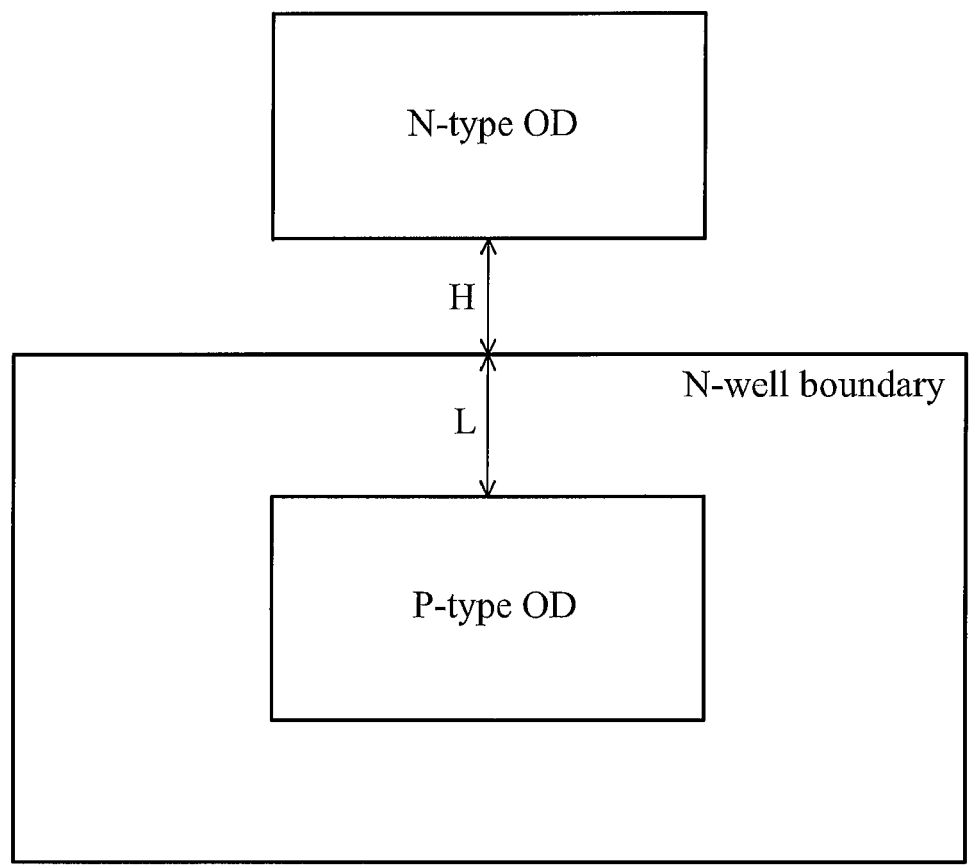

FIGS. 6A-6B illustrates the quantitative relationship between optimized ENx, ENy and minimum design rule dimensions and spacings of a certain processing technology. These limitations were obtained through wafer acceptance tests (WAT) similar to those described above and have been adopted in the embodied manufacturing processes as described below. It is revealed from FIG. 6A that an optimized ENx corresponding to an optimized drive current increase and optimized drive current uniformity is in the range of one to two times either P or G, whichever is larger, where P is the minimum gate poly to P-type OD dimension, and G is the minimum poly-to-poly spacing on an P-type OD region. It is revealed from FIG. 6B that an ENy leading to an optimized drive current increase and optimized drive current uniformity lies in the range of between about one-third to about two-thirds of the sum of L and H, where L is the minimum P-type OD to N-well boundary dimension and H is the minimum spacing between an N-type OD and an N-well.

Similar wafer acceptance test (WAT) has been conducted on CES strained NMOS core transistors. A CES layer is formed over a plurality of NMOS transistors of various configurations to create in-plane tensile strain in the channel region. Although a similar trend is observed where ENx and ENy within a range as described above can lead to improved drive current enhancement and improved drive current uniformity, the effect is less significant than that of a CES strained PMOS device.

Figure 7:
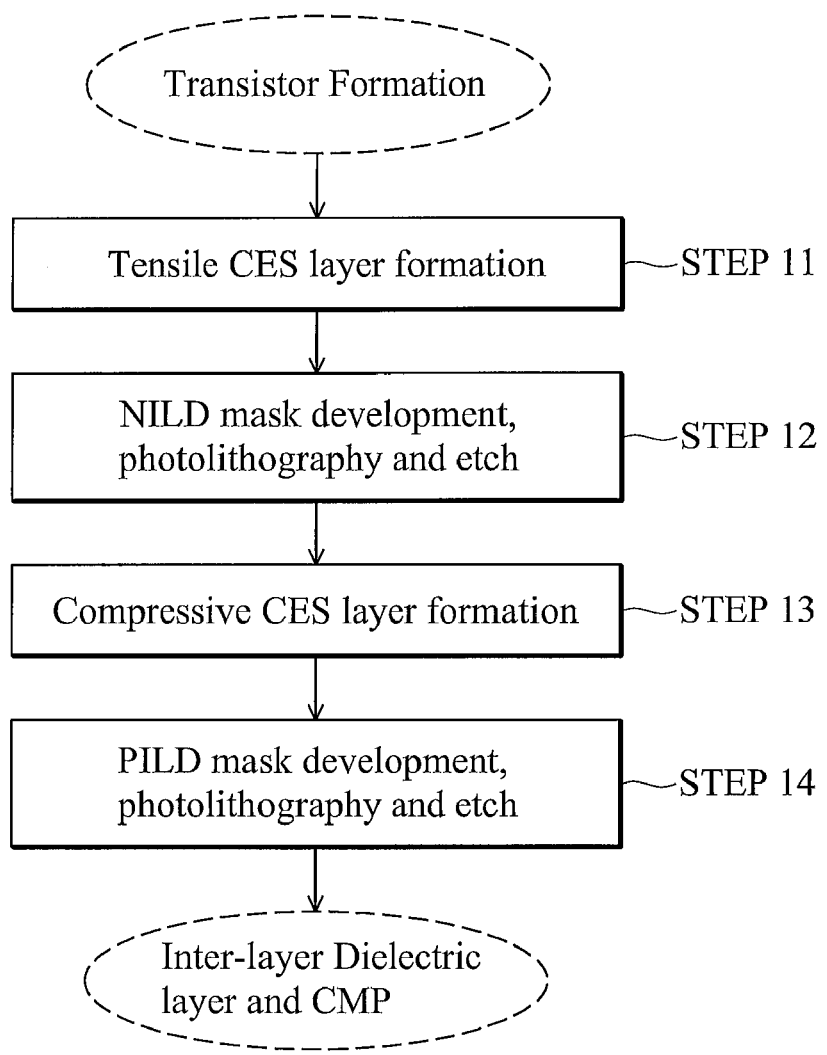
FIG. 7 is a flow chart illustrating the steps of forming the CES layers in a CMOS manufacturing process in a preferred embodiment.

FIG. 7 is a flow chart illustrating the steps of forming the CES layers in a CMOS manufacturing process in a preferred embodiment. FIGS. 8A-8F illustrate cross-sectional views after each processing step described in FIG. 7. To simplify the description, one PMOS device P1 adjacent to an NMOS device N1 is shown in each cross-sectional view. It should be understood that a processing step applied on P1 applies to all PMOS devices on the substrate, and a processing step applied on N1 applies to all NMOS devices on the substrate.

Figure 8A:
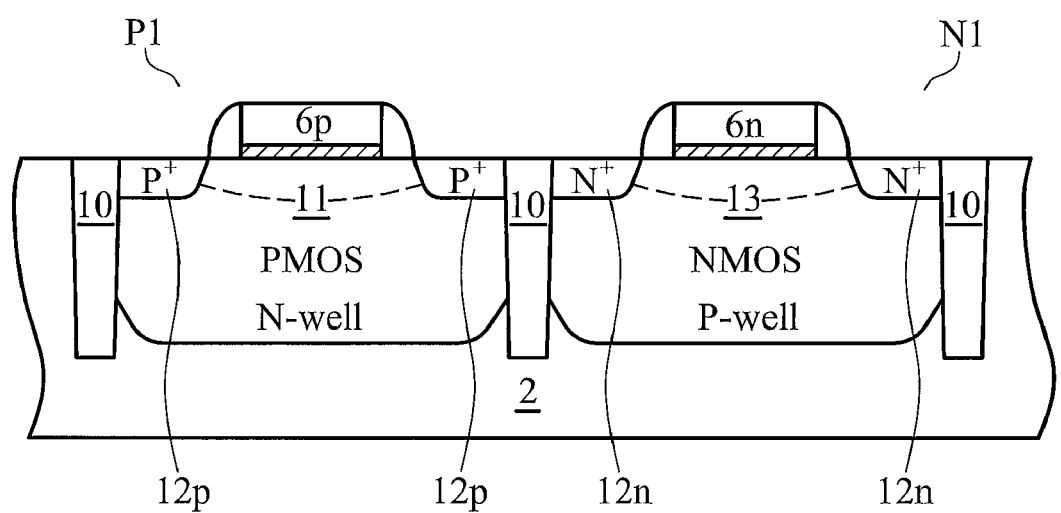
FIGS. 8A-8H illustrate cross-sectional views corresponding to process steps as described in FIG. 7.

FIG. 8A shows a portion of an initial substrate where PMOS device P1 and NMOS device N1 have been formed in semiconductor substrate 2 through a known CMOS manufacturing process. P1 and N1 have a source/drain region 12*p*, 12*n*, and gate region 6*p* and 6*n*, respectively. STIs 10 are used to isolation P1 and N1.

Figure 8B:
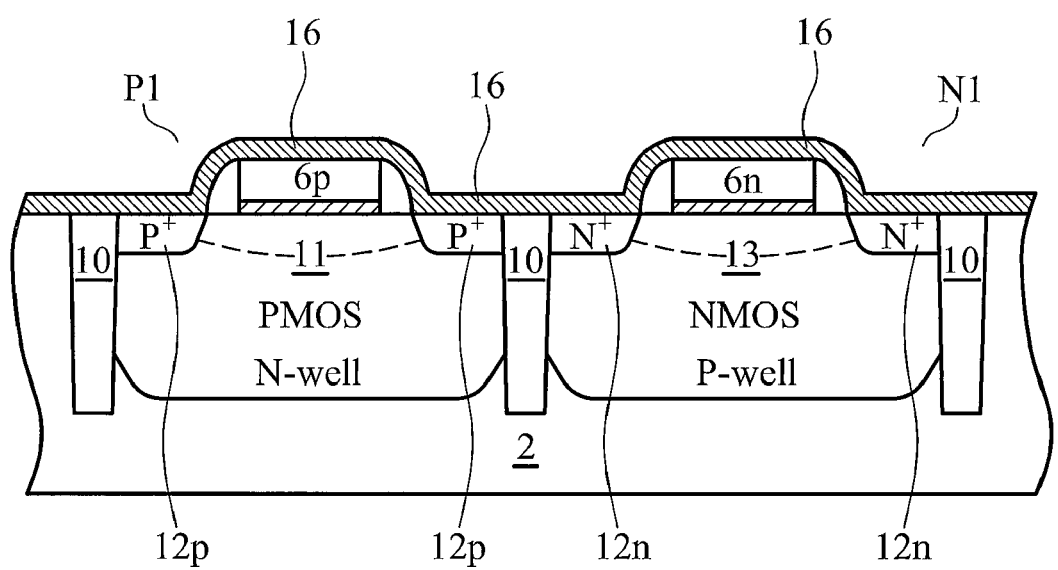

According to STEP 11 in FIG. 7, a tensile CES layer 16 is formed over the substrate, aiming to create tensile strain in the channel region 13 of N1. Layer 16 is made of materials such as silicon nitride, oxynitride, oxide, SiC, SiCN, $CoSi_2$ (Co silicide), $NiSi_2$ (Ni silicide), or any combinations. In one preferred embodiment, CES layer 16 has a thickness of from about 5 nm to about 500 nm. The substrate after STEP 11 is shown in FIG. 8B.

Figure 8C:
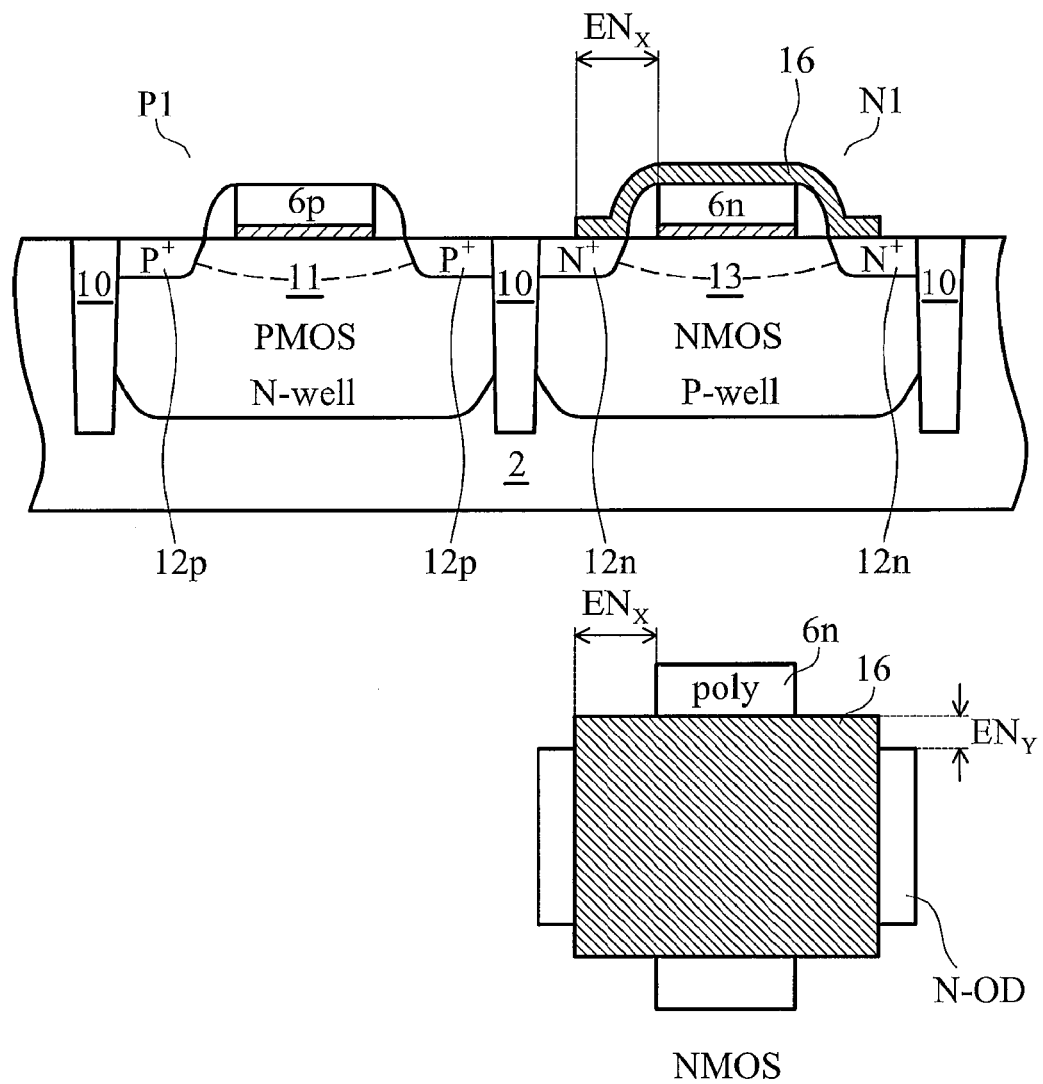

At a STEP 12 in FIG. 7, a photo mask NILD is developed and a photolithography process is conducted to pattern the CES layer 16 over NMOS device N1 with desired ENx and ENy. In developing an NILD photo mask, the desired ENx and ENy values for an NMOS device (obtained through WAT test on NMOS core transistors as described earlier) are provided to an automatic photo mask generating process (also known as "logical operation process" in the art). Also input to said logical operation process are layout information of N-TYPE OD regions, P-well regions, and poly regions on a substrate, which is usually included in the finished design database provided by layout designers of an IC product, as known in the art. The logical operation process will first identify the N-TYPE OD regions on the substrate, where NMOS devices are formed. The logical operation process will then identify the poly regions 6*n* on the foregoing N-TYPE OD regions. Subsequently, the logical operation process will create a photolithography pattern, such that the distance between its horizontal edge and the N-TYPE OD edge is ENy, and the distance from its vertical edge to a gate poly 6*n* edge is ENx. Other operations carried out by the logical operation process include merging two CES layer patterns of same stress type having overlapping edges, merging two adjacent CES layer patterns of same stress type when the space between their edges is less than a pre-determined distance. In creating the photo mask, optical proximity correction (OPC) may be employed to take into account the errors introduced by photolithography system, as known to those skilled in the art. Known photolithography and etch processes are used to pattern CES layer 16 on N1. A result is shown in FIG. 8C in both cross-sectional and top view.

Figure 8D:
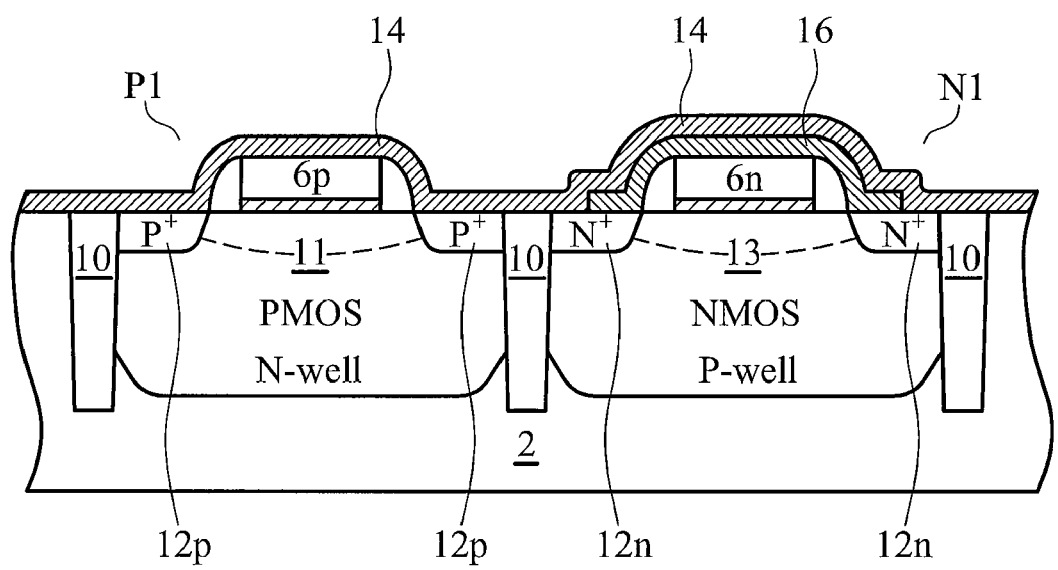

Further, as described in STEP 13 of FIG. 7, a compressive CES layer 14 is formed over the substrate, aiming to create compressive strain in the channel region 11 of PMOS transistor P1. CES layer 14 is made of materials such as silicon nitride, oxynitride, oxide, silicon germanium or any combinations. In one preferred embodiment, CES layer 14 has a thickness of about the same as that of layer 16. In other embodiments, the thickness of CES layer 14 may be substantially different from that of CES layer 16, in order to balance the drive current between P1 and N1. The substrate after STEP 13 is shown in FIG. 8D.

Figure 8E:
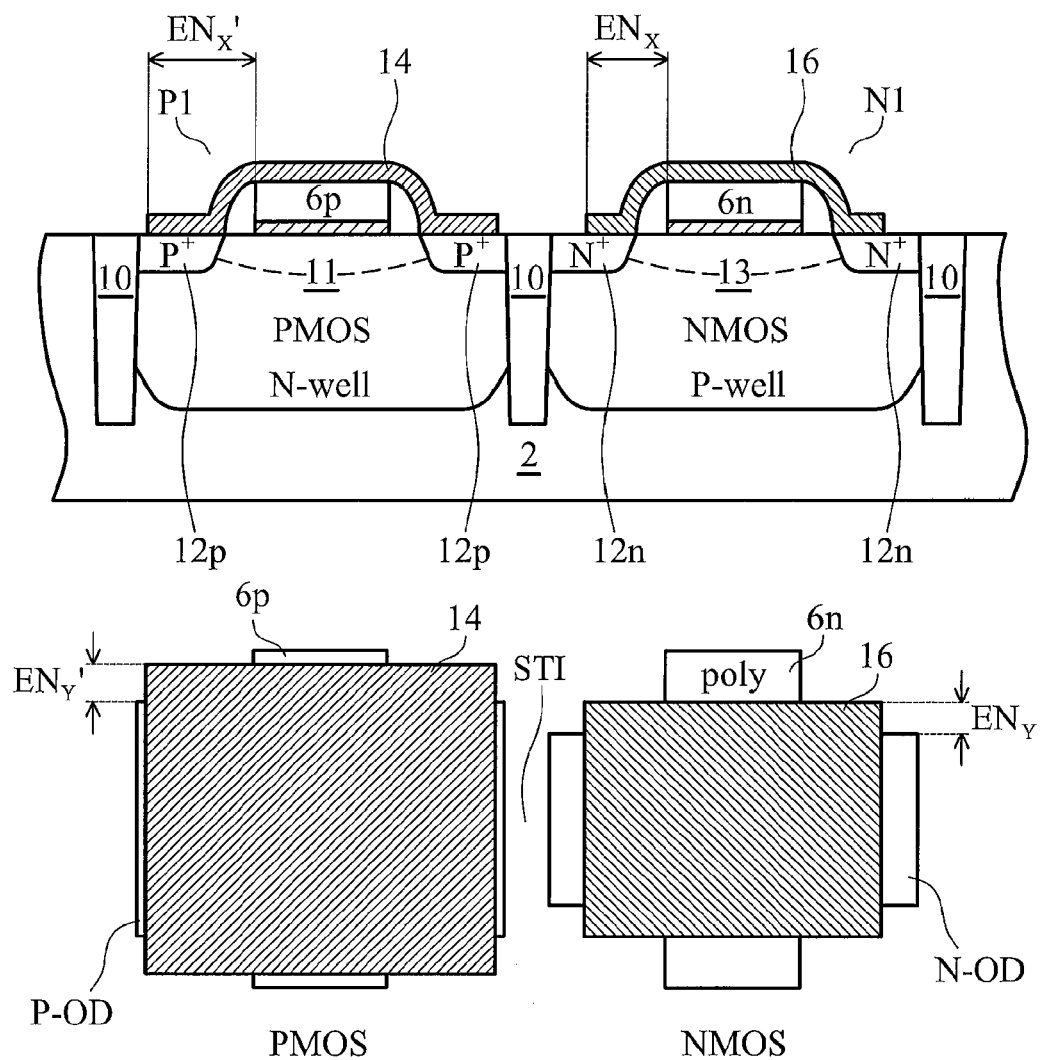

In STEP 14 of FIG. 7, a photo mask PILD is developed and a photolithography process is conducted to pattern the CES layer 14 over PMOS devices with desired ENx' and ENy'. In doing so, the desired ENx' and ENy' values corresponding to optimized PMOS performance are provided to a logical operation process, together with layout information of P-TYPE OD regions, N-well regions, and poly regions on a substrate. The logical operation process will first identify the P-TYPE OD regions on the substrate, where PMOS devices are formed. The logical operation process will then identify the poly regions 6p on the foregoing P-TYPE OD regions. Subsequently, the logical operation process will create a photolithography pattern, such that the distance between its horizontal edge and the P-TYPE OD edge is ENy', and the distance from its vertical edge to a gate poly edge is ENx'. After mask layer PILD is developed, known photolithography and etch processes are used to pattern the CES layer 14 on the P1. A result is shown in FIG. 8E in both cross-sectional and top view.

Figure 8F:
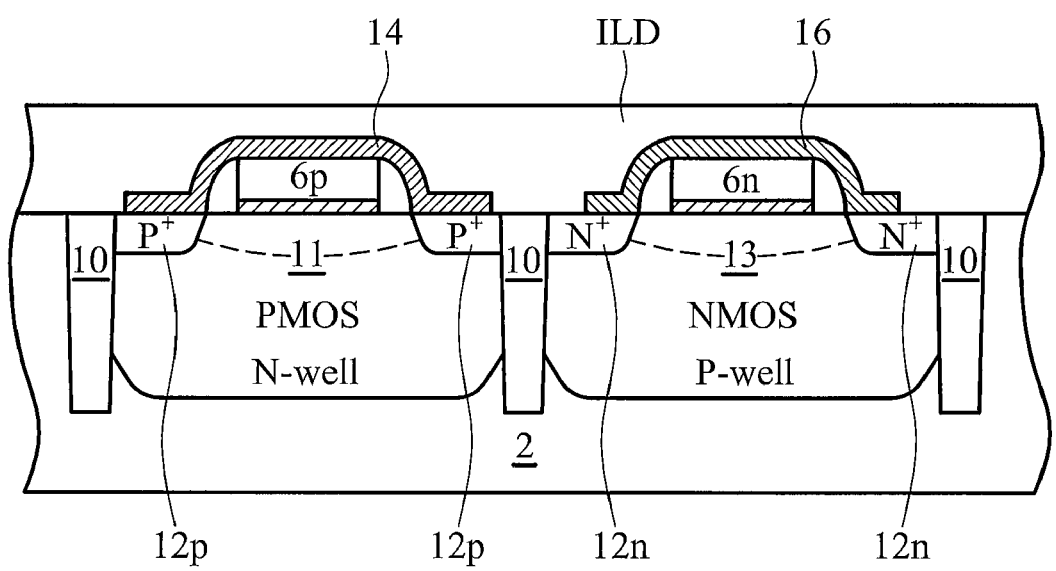

After the formation of the patterned compressive CES layer 14 on PMOS devices and patterned tensile CES layer 16 on NMOS devices, a blanket deposition of $SiO_2$ through CVD is conducted to form a first inter-layer dielectric layer (ILD), although other known materials and methods of forming an ILD layer are not excluded. A planarization process, such as chemical mechanical polishing (CMP) process may then be applied to create a flat substrate surface, as shown in FIG. 8F. Known CMOS manufacturing processes can continue from this point by, for example, cutting contact openings through the ILD where contacts to source/drain regions 12p, 12n and gate electrodes 6p, 6n are needed.

It can be recognized that, after the current processing step, the CES layers formed on substrate 2 surface may have the following lateral configuration. Between MOS transistors of same conductivity type, the adjacent CES layers may be in a tensile-ILD-tensile or compressive-ILD-compressive configuration. Between MOS transistors of opposite conductivity type, the adjacent CES layers have a tensile-ILD-compressive configuration.

In other embodiments, after the formation of the patterned compressive CES layer 14 on PMOS devices and patterned tensile CES layer 16 on NMOS devices, a tensile film 14' or a compressive film 16' may be formed filling the lateral space between adjacent CES layers on substrate 2 surface in order to balance the stresses in the CES layers 14 and 16, thus reaching a desired drive current balance between adjacent NMOS and PMOS devices.

Figure 8G:
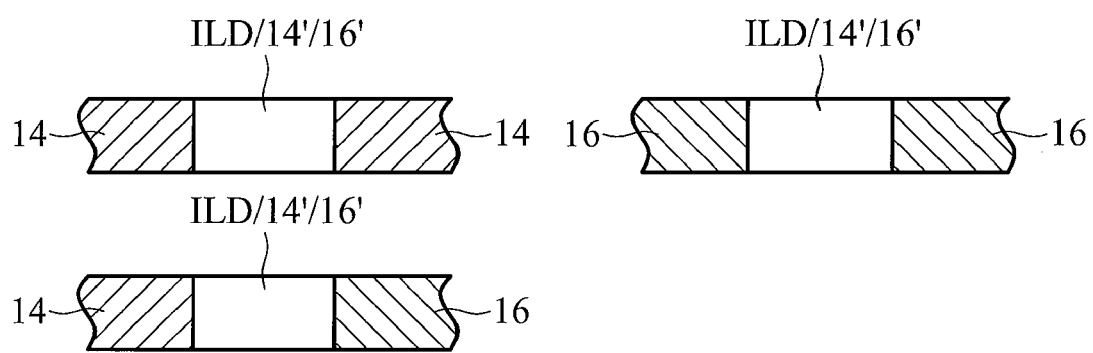

In an additional embodiment, a plurality of PMOS and a plurality of NMOS transistors are formed on a semiconductor substrate through the processes described above. Each of the PMOS and NMOS transistors is covered by a compressive CES layer and a tensile CES layer, respectively, with desired ENx and ENy. In the current embodiment, the CES layer configurations between adjacent MOS devices may include tensile-compressive-tensile, compressive-tensile-compressive, tensile-tensile-tensile, compressive-compressive-compressive, tensile-compressive-compressive, and compressive-tensile-tensile. Various CES layer configurations between adjacent MOS devices are shown in FIG. 8G.

Figure 8H:
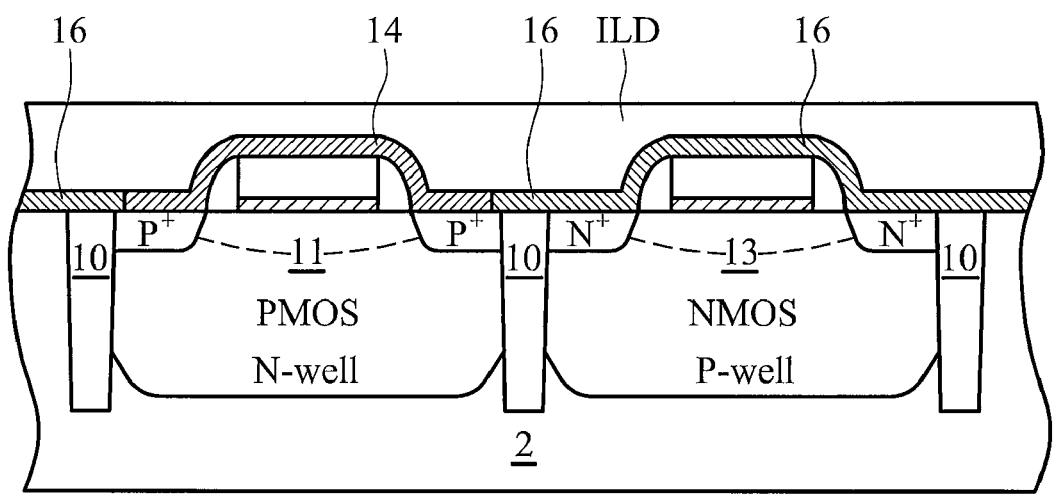

In a further embodiment, a PILD photo mask is first developed by a logical operation process described above to pattern compressive CES layer 14 for optimized PMOS performance. The NILD photo mask is then developed as the reverse of the PILD mask, thus eliminating the cost of creating a dedicated NILP mask. After the processing steps shown in FIG. 7, CES layers cover the entire substrate, as shown in FIG. 8H. This CES layer configuration casts little negative impact on NMOS device performance, because, as described earlier, an NMOS device is less sensitive to ENx and ENy of a tensile CES layer 16 formed thereon. Instead, CES layers thus formed alleviate reliability concerns created by previous embodiments, such as voids formed between adjacent CES layer edges, film edge peeling during subsequent process steps.

In an even further embodiment, a single photo mask PILD is developed by a logical operation process to pattern compressive CES layer 14 for optimized PMOS performance. The same mask layer is applied a second time on negative photoresist to pattern tensile CES layer 16. An NILD photo mask is not necessary, thus further reducing the cost of mask development.

As can be recognized by those skilled in the art, the preferred embodiments improve device performance without adding complex processing steps. Moreover, the added process steps can be readily integrated into a known CMOS process flow. Furthermore, the creation of NILD and PILD photo masks does not require additional works or changes on an existed design database. Optimized ENx and ENy corresponding to a certain technology node apply to all design projects developed using the same technology. No extra design rules are imposed on design and layout engineers.

Figure 9:
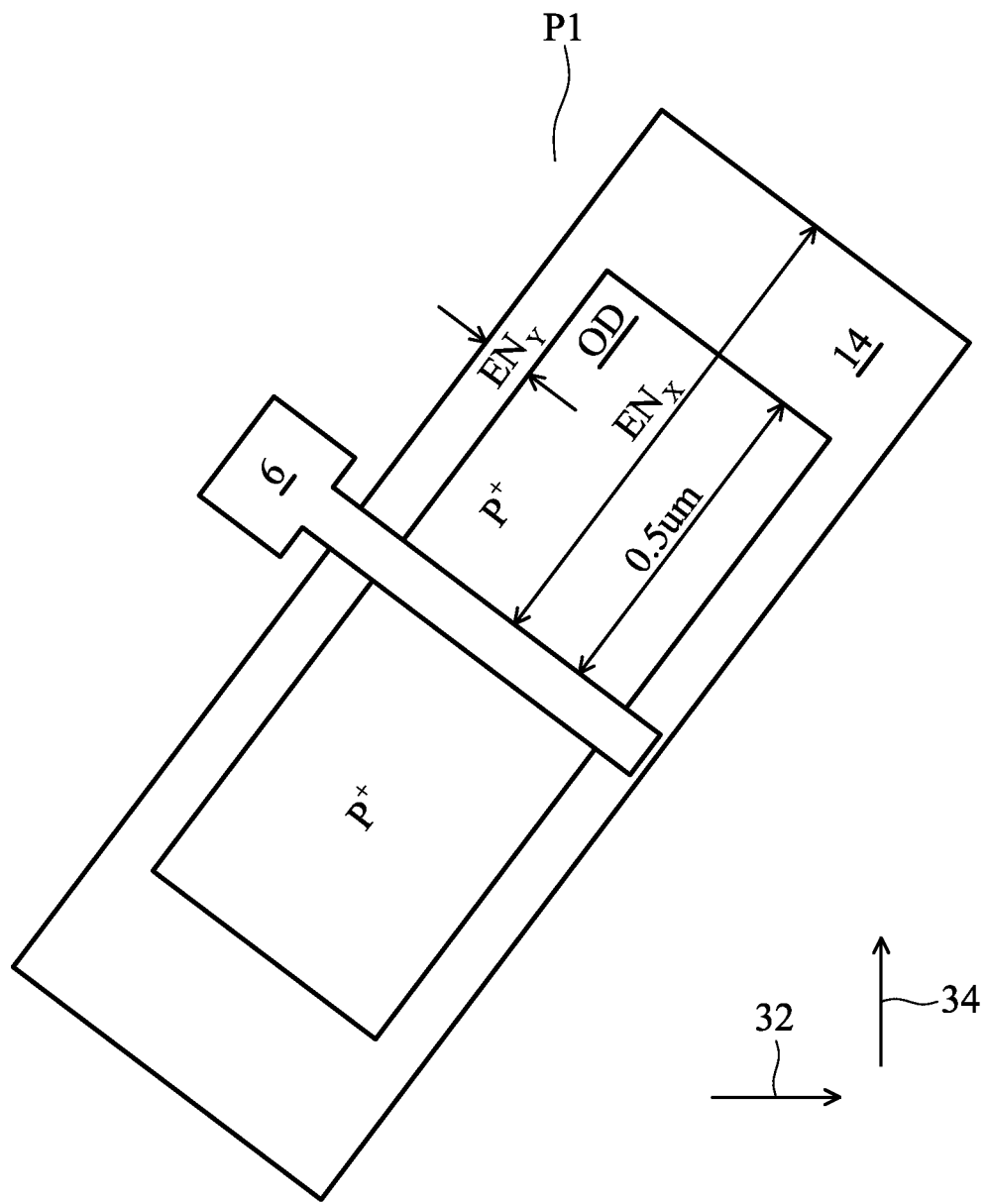
FIG. 9 shows a CES strained PMOS transistor P1 in a preferred embodiment having a rotated orientation.

Although the present invention and its advantages have been described in detail, it should be understood that various changes, substitutions and alterations can be made herein without departing from the spirit and scope of the invention as defined by the appended claims. As an additional example shown in FIG. 9, a CES strained PMOS transistor P1 is rotated from the orientation of the previous embodiments such that the opposing edges of poly gate 6, P-TYPE OD region and the CES strained layers 14 are not aligned with the horizontal direction 32 and vertical direction 34. In this case, ENx is the shortest distance between the edge of poly gate 6 and the edge of strained layer 14, while ENy is the shortest distance between the P-TYPE OD edge and the edge of strained layer 14. Furthermore, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device formed in a substrate comprising:
   an active region;
   a gate electrode overlying the active region;
   a source region and a drain region formed on opposite sides of the gate electrode, the source region and the drain region being substantially aligned with the electrode; and
   a strain-induced layer substantially conformally over the gate electrode and the active region;
   wherein a first shortest distance between a first gate edge of the gate electrode and a first outermost edge of the strain-induced layer along a direction parallel to a current flow between the source region and the drain region in a plan view is greater than 0.4 um, wherein the strain-induced layer extends a shorter distance from the first gate edge than the active region in the direction parallel to the current flow;
   wherein a second shortest distance between a first edge of the active region and a second outermost edge of the strain-induced layer along a direction perpendicular to the current flow between the source region and the drain region in a plan view is between about 60 nm to about 400 nm.

2. The semiconductor device of claim 1 is a PMOS transistor and said strain-induced layer is a compressive-stress layer.

3. The semiconductor device of claim 2 wherein said compressive-stress layer comprises one of SiN (silicon nitride), oxynitride, oxide, SiGe or the combinations of the elements above.

4. The semiconductor device of claim 1 wherein said substrate is one of an N-well formed on a silicon substrate, a bulk silicon substrate, a substrate made of strained semiconductor, compound semiconductor, multi-layers semiconductor, silicon on insulator (SOI), and the like.

5. The semiconductor device of claim 1 wherein said strain-induced layer has a multi-layers configuration.

6. The semiconductor device of claim 1 wherein said strain-induced layer has a thickness from about 5 nm to about 500 nm.

7. The semiconductor device of claim 1 wherein said source region and drain region further comprises a material having a lattice constant different from that of the surrounding substrate material.

8. A semiconductor device formed in a semiconductor substrate comprising:
   a first PMOS transistor formed in a P-type active region, the first PMOS transistor comprising a first poly gate electrode overlying the P-type active region;
   an first NMOS transistor formed in an N-type active region, the first NMOS transistor comprising a second poly gate electrode overlying said N-type active region; and
   a first compressive-stress layer substantially conformally over the first poly gate electrode and the P-type active region;
   wherein a first shortest distance in a first direction parallel with a current flow of the first PMOS transistor and between the first poly gate electrode and a first outermost edge of the first compressive-stress layer is greater than 0.4 um, wherein at least a portion of the first outermost edge of the first compressive-stress layer is located over the P-type active region;
   wherein a second shortest distance in a second direction perpendicular with the current flow of the first PMOS transistor and between the P-type active region and a second outermost edge of the first compressive-stress layer is in a range of between about 60 nm to about 400 nm.

9. The semiconductor device of claim 8, wherein said first compressive-stress layer comprises one of SiN (silicon nitride), oxynitride, oxide, SiGe or the combinations of the elements above.

10. The semiconductor device of claim 8, wherein the first NMOS transistor further comprises a first tensile-stress layer substantially conformally over the second gate electrode and said N-type active region.

11. The semiconductor device of claim 10, wherein said first tensile-stress layer comprises one of SiN (silicon nitride), oxynitride, oxide, SiC, SiCN, CoSi2 (Co silicide), NiSi2 (Ni silicide), or the combinations of the elements above.

12. The semiconductor device of claim 10, wherein the lateral space between said first tensile-stress layer and said first compressive-stress layer is filled with one of an ILD layer, a dielectric layer having tensile-stress and a dielectric layer having compressive-stress.

13. The semiconductor device of claim 10 further comprises a second PMOS transistor and a second NMOS transistor, covered with a second compressive-stress layer and a second tensile-stress.

14. The semiconductor device of claim 10, wherein said first tensile-stress layer substantially conformally over the portion of the substrate, which is not over with the compressive-stress layer, respectively; wherein the lateral space between said first and second tensile-stress layers and the lateral space between said first and second compressive-stress layers is filled with one of an ILD layer, a dielectric layer having tensile-stress and a dielectric layer having compressive-stress.

15. The semiconductor device of claim 10, wherein said tensile-stress layer and said compressive-stress layer have a different film thickness.

16. The semiconductor device of claim 10, wherein the first PMOS and the first NMOS transistor further comprise a source and drain region, respectively, wherein said source and drain region comprise an epitaxial layer having a lattice constant different from that of the surrounding substrate material.

17. A PMOS transistor formed in a P-type active region (OD) in a semiconductor substrate comprising:
   a gate region overlying the OD region having a poly gate electrode on the top;
   a source and drain region formed on the opposite side of the gate region, substantially aligned with an edge of the gate region and the edges of the OD region;
   a compressive-stress layer substantially conformally over the gate electrode and the OD region, the compressive-stress layer having a first and second edge, wherein the first edge is an outermost edge of the compressive-stress layer;
   wherein the space between an edge of the gate electrode and the first edge of the compressive-stress layer is in the range of one to two times either P or G, whichever is larger, where P is the minimum design rule gate poly to P-type OD dimension, and G is the minimum design rule poly-to-poly spacing on a P-type OD region; and
   wherein the space between a P-type OD edge and the second edge of the compressive-stress layer is in the range of between about one-third to about two-thirds of the sum of L and H, where L is the minimum P-type OD to N-well boundary dimension and H is the minimum spacing between an N-type OD and an N-well boundary; and wherein the compressive-stress layer has at least a portion of the first edge located over the OD region.

18. The PMOS transistor of claim 17 wherein said compressive-stress layer comprises one of SiN (silicon nitride), oxynitride, oxide, SiGe or the combinations of the elements above.

19. The PMOS transistor of claim 17 wherein said source and drain region further comprises a material having a lattice constant different from that of the surrounding substrate material.

20. The PMOS transistor of claim 17 has a rotated orientation such that the opposing edges of said poly gate electrode are not aligned with a horizontal and a vertical direction.

* * * * *